United States Patent
MacDonald, Jr. et al.

(10) Patent No.: US 6,195,267 B1
(45) Date of Patent: Feb. 27, 2001

(54) GEL STRUCTURE FOR COMBINED EMI SHIELDING AND THERMAL CONTROL OF MICROELECTRONIC ASSEMBLIES

(75) Inventors: James D. MacDonald, Jr.; Walter M. Marcinkiewicz, both of Apex, NC (US)

(73) Assignee: Ericsson Inc., Research Triangle Park, NC (US)

(*) Notice: Subject to any disclaimer, the term of this patent is extended or adjusted under 35 U.S.C. 154(b) by 0 days.

(21) Appl. No.: 09/338,818

(22) Filed: Jun. 23, 1999

(51) Int. Cl.[7] ............................. H05K 7/20; H05K 9/00
(52) U.S. Cl. .................... 361/800; 361/704; 361/752; 361/816; 174/35 R
(58) Field of Search .................. 439/68, 86, 178; 361/688, 704, 715, 712, 717–720, 752, 800, 816, 818; 174/35 GC, 35 MS, 35 R; 442/117; 257/659

(56) References Cited

U.S. PATENT DOCUMENTS

| | | |
|---|---|---|
| 4,008,300 | 2/1977 | Ponn . |
| 4,770,641 | 9/1988 | Rowlette . |
| 4,855,868 * | 8/1989 | Harding ........................... 361/816 |
| 5,074,799 | 12/1991 | Rowlette, Sr. . |
| 5,294,826 * | 3/1994 | Marcantonio et al. ............. 257/659 |
| 5,424,652 | 6/1995 | Hembree et al. . |
| 5,561,265 * | 10/1996 | Livshits et al. ................. 174/35 GC |
| 6,090,728 * | 7/2000 | Yenni, Jr. et al. ................. 442/117 |

* cited by examiner

Primary Examiner—Jayprakash N. Gandhi
(74) Attorney, Agent, or Firm—Wood, Phillips, VanSanten, Clark & Mortimer

(57) ABSTRACT

A shielding and thermal dissipation structure for an electronic assembly including a distribution circuit and at least one electronic component mounted on a surface of the distribution circuit. A plastic housing overlays the at least one electronic component, and includes an outer periphery defining a housing interior and substantially surrounding the outer periphery of the at least one electronic component. A closed end on one side of the housing outer periphery has an interior surface facing the at least one electronic component with a metal coating about 5 microns thick on the interior surface. The metal coating is chosen from the group of nickel and gold. An electrically conductive gel in the housing interior about the plastic housing outer periphery (and preferably including carbon particles or carbon fibers) is in intimate contact with the distribution circuit and the metal coating. And a thermally conductive gel is disposed between the at least one electronic component and the housing closed end interior surface, and preferable includes particles of at least one of the group of aluminum oxide, aluminum nitride, and boron nitride.

22 Claims, 2 Drawing Sheets

GEL STRUCTURE FOR COMBINED EMI SHIELDING AND THERMAL CONTROL OF MICROELECTRONIC ASSEMBLIES

BACKGROUND OF THE INVENTION

1. Technical Field

The present invention is directed toward electronic devices, and more particularly toward mounting and protecting microelectronic assemblies.

2. Background Art

Electronic devices, particularly portable microelectronic devices such as cellular phones, are subject to a wide variety of conditions which can interfere with proper operation of the device. For example, vibrations can cause wear at contact interfaces internal to the microelectronic device. This wear may generate contaminants, such as metal particles, that can migrate through the microelectronic device and degrade the performance of the microelectronic device. Additionally, such wear can increase the resistance of the contact interface, which also inhibits the performance of the microelectronic device. Still further, shock loads (e.g., from dropping the device) which may not be sufficient to visibly break the device can nevertheless cause the microelectronic circuitry to lose contact interfaces so as to prevent proper operation of the circuitry.

Such devices are also subjected to environmental contaminants, including moisture and dust which, if allowed to reach to the circuitry, can also interfere with its proper operation.

Thermal loads resulting from the operation of the circuitry can also cause the device and/or the microcircuitry to degrade over time. Still further, electro-magnetic impulses (EMI) or other radio frequencies (RF) in the environment can interfere with the proper operation of the microcircuitry, including particularly wireless communication devices such as cellular telephones. Such problems are common to all microelectronic assemblies using chip scale packages (CSP's) and Flip Chip packages.

Electronic circuit components have been mounted within their devices in a wide variety of manners. For example, thermally conductive gels have been used to dissipate heat from the microcircuitry of such devices.

Further, shield structures such as cans, lids, and metalized frames having electrical connection through an ohmic connection along the periphery of the shielding member have been used to provide EMI shielding and thermal control and CSP's and Flip Chip architectures. The ohmic connection is usually made with solder, conductive elastomers or compression contacts using precious metals. Thermal control has commonly been provided by conductive materials in intimate contact with the power dissipating packages which provide a low resistance path to the body of the device.

However, mounting devices such as metal cans with solder sealing for ohmic contact are difficult to assemble automatically and therefore are subject to high assembly costs and further are subject to possible uneven assembly among multiple devices. Further, if pressure contacts are used for ohmic contact for EMI shielding, high force levels are required for each contact point which can also cause problems in assembly. For example, the force required is usually greater than that which can be provided by a plastic housing without yielding the plastic, and therefore secondary fasteners or clips can be required, further increasing not only assembly costs but also costs of materials. Use of conductive elastomers require even greater force levels to maintain ohmic contact. Still further, none of these structures are entirely satisfactory for excluding moisture and dust, nor do they provide the full combination of protection of the microcircuitry from contaminants and from vibrations and shocks while also providing EMI shielding and thermal dissipation.

The present invention is directed toward overcoming one or more of the problems set forth above.

SUMMARY OF THE INVENTION

In one aspect of the present invention, a shielding and thermal dissipation structure is provided for an electronic assembly including a distribution circuit and at least one electronic component mounted on a surface of the distribution circuit. The structure includes a plastic housing overlaying the at least one electronic component. The housing includes an outer periphery defining a housing interior and substantially surrounding the outer periphery of the at least one electronic component, and a closed end on one side of the housing outer periphery, the closed end having an interior surface facing the at least one electronic component. A metal coating is provided on the closed end interior surface. An electrically conductive gel is in the housing interior about the plastic housing outer periphery and a thermally conductive gel is disposed between the at least one electronic component and the housing closed end interior surface.

In one preferred form, the electrically conductive gel is in intimate contact with the distribution circuit. In another preferred form, the electrically conductive gel is in intimate contact with the distribution circuit and the metal coating.

In still another preferred form, the electronic assembly includes an exterior housing, and a second thermally conductive gel is provided between the exterior housing and an exterior surface of the plastic housing closed end.

In yet another preferred form, the metal coating is about 5 microns thick, if deposited as a pure metal. Metal coatings composed of silver particles in a polymer matrix are useful at 10–20 microns thick.

Another preferred form of this aspect of the invention has the metal coating chosen from the group of nickel and gold and the electrically conductive gel includes carbon. In still further preferred forms, the carbon comprises carbon particles or carbon fibers, and/or the thermally conductive gel includes particles of at least one of the group of aluminum oxide, aluminum nitride, and boron nitride.

In another aspect of the present invention, a shield and thermal dissipater is provided for an electronic assembly including an electronic chip on a printed circuit board. A plastic housing is open on one side and defines a central interior region and a peripheral interior region around the central interior region, with an interior surface facing the interior regions. A metalized plating is provided on the plastic housing interior surface, and an electrically conductive gel is provided in the housing peripheral interior region on the metalized plating. A thermally conductive gel is provided in the housing central region on the metalized plating, and includes a cavity facing the housing open side for receiving the electronic chip on the printed circuit board.

Preferred forms of the invention such as described with the first aspect of the present invention may also be used with this aspect of the invention.

It is an object of the invention to provide an inexpensive and reliable structure for protecting electronic components against vibrations and shock, and against the performance degrading effects of heat and electro-magnetic fields.

DESCRIPTION OF THE PREFERRED EMBODIMENT

Figure 1:
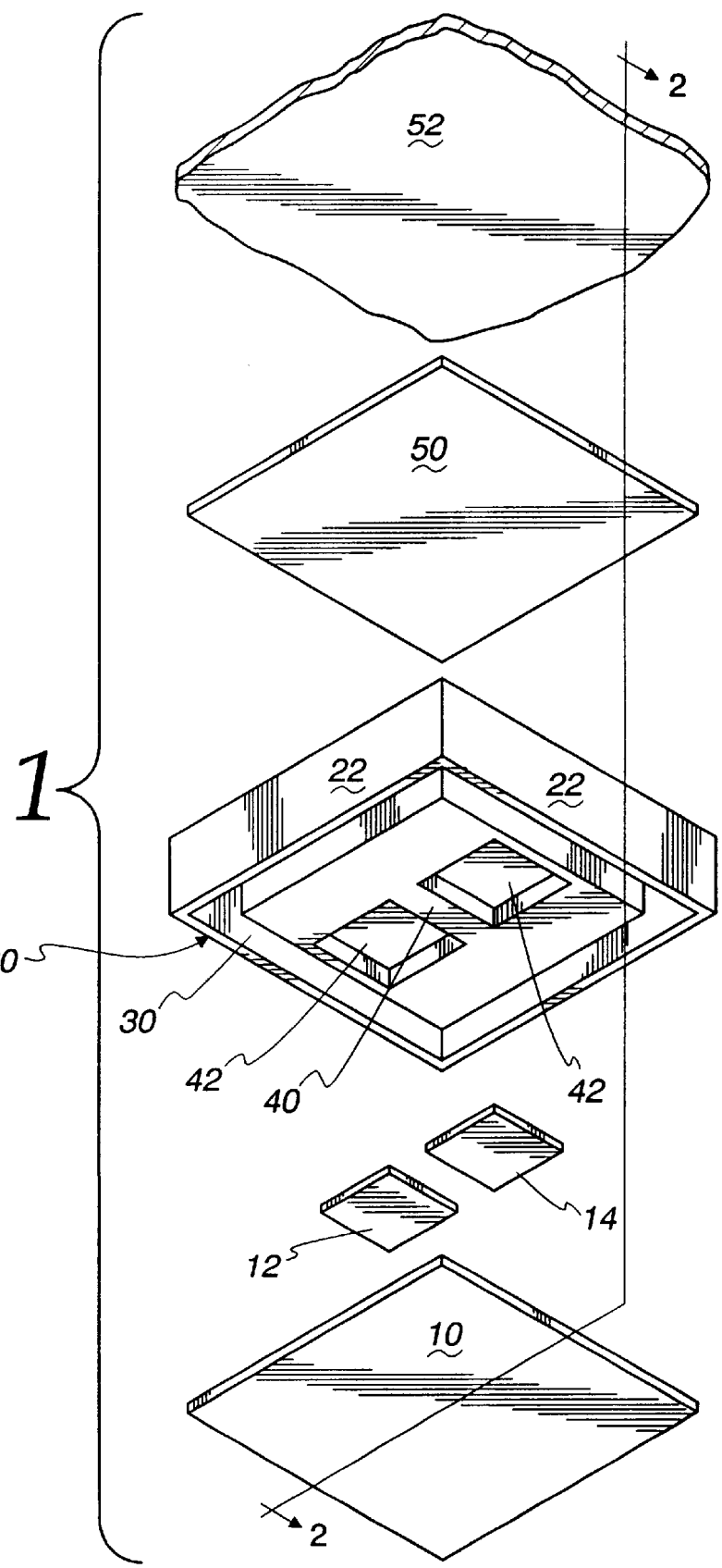
FIG. 1 is an exploded perspective view of an electronic circuit and shielding and thermal dissipation structure embodying the present invention.
Figure 2:
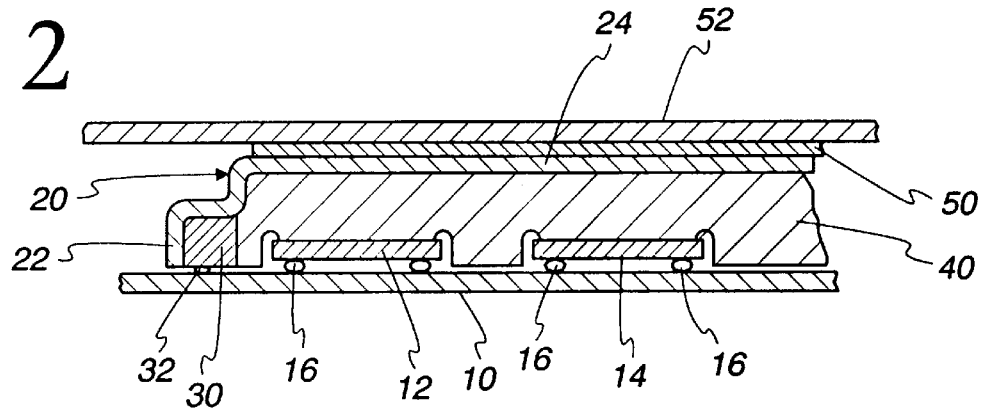
FIG. 2 is a cross-sectional view taken along line 2—2 of FIG. 1.
Figure 3:
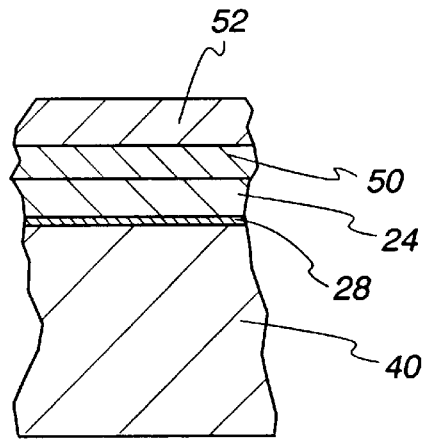
FIG. 3 is an enlarged cross sectional view of a portion of FIG. 2.

FIGS. 1–3 illustrate a preferred embodiment of the present invention as usable with an electronic assembly such as might be usable in virtually any electronic device, but which can be particularly advantageously used with portable electronic assemblies such as cellular telephones.

In the illustrated example, a printed circuit board (PCB) 10 is provided to suitably interconnect suitable microcircuitry chips 12, 14, such as Flip Chips or chip scale packages (CSP). As illustrated in FIG. 2, the chips 12, 14 are suitably connected to the PCB 10, as by the discrete mechanical connections 16 shown in the form of solder balls.

A plastic housing 20 is provided, and has an outer periphery 22 which is closed on one side (defined by top wall 24 shown in FIGS. 2 and 3) and open on the other side of the periphery 22 (the bottom side in the Figures) which faces the PCB 10 and chips 12, 14. For most applications, including for example cellular telephones, this plastic housing 20 can be relatively thin (for example, 0.05 mm thick) and made of plastic such as polyetherimide or other suitable plastics which can withstand 125 degree C. operating temperatures without permanent deformation.

In accordance with the present invention, the plastic housing 20 is metalized on its interior surface, preferably with Nickel or Gold, in sufficient thickness for shielding the circuitry. This metal coating or metalized plating 28 is shown in FIG. 3 and, for applications such as cellular telephones, should preferably be at least about 5 microns thick, although greater thicknesses could, of course, be used. Coatings with silver particles in a polymer matrix are preferably 10–20 microns thick.

Molded within the interior of the housing 20 around its outer periphery 22 (that is, in a peripheral interior region) is an electrically conductive gel 30. The gel 30 is in intimate contact with a metalized pattern on the PCB 20, for example through a solder ball 32 between the two. The gel 30 may be a silicone elastomer filled with suitable materials to enhance its electrical conductivity. For example, carbon particles or carbon fibers or a combination of both can be included in a silicone elastomer gel to provide an environmentally stable contact with the metalized plating 28 on the inner surface of the housing 20. This thus provides an excellent EMI and RF shielding for the chips 12, 14 contained in the housing interior as further described below.

Specifically, molded within the interior of the housing 20 inside of the electrically conductive gel 30 (that is, in a central interior region surrounded by the peripheral outer region) is a thermally conductive gel 40. When molded, the thermally conductive gel 40 is cast to form negative cavities 42 matching the placement of components such as chips 12, 14 on the PCB 10.

The thermally conductive gel 40 may also be a silicone elastomer, but filled with suitable materials to enhance its thermal conductivity. For example, particles of alumina (aluminum oxide), aluminum nitride, or boron nitride or combinations thereof may be included in the gel 40 to provide low electrical conductivity and a dielectric constant value so as to not effect circuit performance (due to its intimate contact with the chips 12, 14 and PCB 10) while also providing good thermal conductivity, taking heat away from the PCB 10 and chips 12, 14 and to the housing 20 (and particularly its top wall 24) to prevent overheating of the circuitry. In addition to dissipation of heat, the gel 40 adheres to the chips 12, 14 and PCB 10 by surface tension, thereby allowing the a reliable contact to be maintained without high clamping forces. This also allows clamping of the components together without secondary fasteners, as simple snap together plastic housing connectors can be used. Thus, this structure avoids the assembly problems associated with some prior art as noted above in the Background. This surface tension contact is also sufficient to exclude moisture and dust and other environmental contaminants under most operating conditions as might be expected, for example, with cellular telephones. Use of a thermally conductive gel such as above is also described in U.S. patent appl. Ser. No. 08/995,388, filed Dec. 22, 1997 by James D. MacDonald, Jr., Walter M. Marcinkiewicz and Rahul Gupta, and entitled "Shock and Vibration Attenuating Structure for an Electronic Assembly", and that complete contents of that application are hereby incorporated by reference.

In the embodiment shown in FIGS. 1–3, a second layer of thermally conductive gel 50 may also be provided on the exterior surface of the plastic housing 20 and extending to an outer housing 52 of the device (for example, the exterior housing of a cellular telephone) to further assist in thermal dissipation. This structure thus allows leeway in manufacturing tolerances when assembling the device, in addition to allowing significant flexure of the outer housing 52 during use without breaking contact of the gel 40 with the PCB 10. In should be recognized, however, that it would be within the scope of the present invention to use the device housing itself as the plastic housing, with the interior of the device housing metalized and the interior thermally conductive gel 40 directly contacting the metalized interior surface of the device housing.

Figure 4:
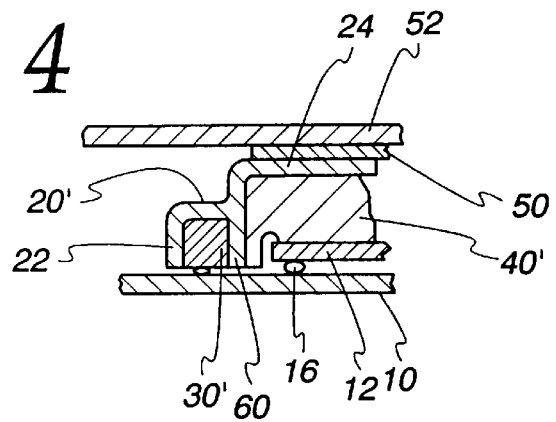
FIG. 4 is a cross-sectional view similar to FIG. 2 but illustrating an alternative embodiment of the present invention.

FIG. 4 illustrates an alternative embodiment of the present invention. Identical components to those in the first described embodiment are given the same reference numbers and similar but modified components are given the same reference numbers with prime "'" added.

As can be readily seen from the drawings, with this alternate embodiment, an additional wall 60 is formed with the plastic housing 20' so as to separate the peripheral and central interior regions. This additional wall 60 can be used to facilitate molding of the gels 30', 40', which would then be separated rather than in direct contact. It should be appreciated, however, that with such a structure the metalized plating (not shown on FIG. 4) would necessarily extend around the wall 60 or some other electrical contact would be required in order to maintain an electrical contact between the surface of the housing 20' contacted by the electrically conductive gel 30' with the metalized plating on the interior surface of the top wall 24.

It should thus be appreciated that the present invention may be easily, inexpensively, and reliable assembled in a wide variety of devices. Still further, it should be appreciated that this invention will provide a simple and reliable structure providing EMI/RF shielding, thermal control, and shock/vibration attenuation, as well as protecting the electronic components from environmental contaminants such as moisture and dust.

Still other aspects, objects, and advantages of the present invention can be obtained from a study of the specification, the drawings, and the appended claims. It should be understood, however, that the present invention could be used in alternate forms where less than all of the objects and advantages of the present invention and preferred embodiment as described above would be obtained.

What is claimed is:

1. A shielding and thermal dissipation structure for an electronic assembly including a distribution circuit and at least one electronic component mounted on a surface of the distribution circuit, comprising:
   a plastic housing overlaying the at least one electronic component, said housing including
      an outer periphery defining a housing interior and substantially surrounding the outer periphery of the at least one electronic component, and
      a closed end on one side of the housing outer periphery, said closed end having an interior surface facing said at least one electronic component;
   an electrically conductive gel in said housing interior about said plastic housing outer periphery;
   a metal coating on the surface of the plastic housing interior; and
   a thermally conductive gel between said at least one electronic component and said closed end interior surface.

2. The structure of claim 1, wherein said electrically conductive gel is in intimate contact with said distribution circuit.

3. The structure of claim 1, wherein said electrically conductive gel is in intimate contact with said distribution circuit and said metal coating.

4. The structure of claim 1, wherein said electronic assembly includes an exterior housing, and further comprising a second thermally conductive gel between said exterior housing and an exterior surface of said plastic housing closed end.

5. The structure of claim 1, wherein said metal coating is between 4 and 50 microns thick.

6. The structure of claim 5, wherein said metal coating is about 5 microns thick.

7. The structure of claim 1, wherein said metal coating is chosen from the group of nickel and gold and said electrically conductive gel includes carbon.

8. The structure of claim 7, wherein said carbon comprises carbon particles in said electrically conductive gel.

9. The structure of claim 7, wherein said carbon comprises carbon fibers in said electrically conductive gel.

10. The structure of claim 1, wherein said thermally conductive gel has low electrical conductivity.

11. The structure of claim 10, wherein said thermally conductive gel includes particles of at least one of the group of aluminum oxide, aluminum nitride, and boron nitride.

12. A shield and thermal dissipater for an electronic assembly including an electronic chip on a printed circuit board, comprising:
   a plastic housing open on one side and defining a central interior region and a peripheral interior region around said central interior region, said housing including an interior surface facing said interior regions;
   a metalized plating on the plastic housing interior surface;
   an electrically conductive gel in said housing peripheral interior region on said metalized plating; and
   a thermally conductive gel in said housing central region on said metalized plating, said thermally conductive gel including a cavity facing said housing open side for receiving said electronic chip on the printed circuit board.

13. The shield and thermal dissipater of claim 12, wherein said electrically conductive gel is in intimate contact with said printed circuit board.

14. The shield and thermal dissipater of claim 12, wherein said electrically conductive gel is in intimate contact with said printed circuit board and said metalized plating.

15. The shield and thermal dissipater of claim 12, wherein said electronic assembly includes an exterior housing, and further comprising a second thermally conductive gel between said exterior housing and an exterior surface of said plastic housing opposite the interior surface facing the housing central region.

16. The shield and thermal dissipater of claim 12, wherein said metalized plating is between 4 and 50 microns thick.

17. The shield and thermal dissipater of claim 16, wherein said metalized plating is about 5 microns thick.

18. The shield and thermal dissipater of claim 12, wherein said metalized plating is chosen from the group of nickel and gold and said electrically conductive gel includes carbon.

19. The shield and thermal dissipater of claim 18, wherein said carbon comprises carbon particles in said electrically conductive gel.

20. The shield and thermal dissipater of claim 18, wherein said carbon comprises carbon fibers in said electrically conductive gel.

21. The shield and thermal dissipater of claim 12, wherein said thermally conductive gel has low electrical conductivity.

22. The shield and thermal dissipater of claim 21, wherein said thermally conductive gel includes particles of at least one of the group of aluminum oxide, aluminum nitride, and boron nitride.

* * * * *